(12) United States Patent
Moriya et al.

(10) Patent No.: US 6,720,837 B2
(45) Date of Patent: Apr. 13, 2004

(54) SURFACE MOUNTING CRYSTAL OSCILLATOR

(75) Inventors: Kouichi Moriya, Saitama (JP); Kuichi Kubo, Saitama (JP); Katsuyuki Sato, Saitama (JP); Yoshinori Narita, Saitama (JP)

(73) Assignee: Nihon Dempa Kogyo Co., Ltd, Tokyo (JP)

( * ) Notice: Subject to any disclaimer, the term of this patent is extended or adjusted under 35 U.S.C. 154(b) by 53 days.

(21) Appl. No.: 10/254,620

(22) Filed: Sep. 25, 2002

(65) Prior Publication Data

US 2003/0058056 A1 Mar. 27, 2003

(30) Foreign Application Priority Data

Sep. 25, 2001 (JP) .......................... 2001-291832

(51) Int. Cl.[7] .................................. H03B 5/32
(52) U.S. Cl. ......................... 331/158; 331/68
(58) Field of Search ................. 331/158, 68, 116 R; 361/752, 783; 333/191, 192

(56) References Cited

U.S. PATENT DOCUMENTS

2002/0047749 A1 * 4/2002 Sugawara ................... 331/158
2002/0084858 A1 * 7/2002 Luff ............................. 331/68
2002/0135429 A1 * 9/2002 Akagawa et al. ............. 331/68
2003/0025567 A1 * 2/2003 Kubo et al. ................. 331/158

FOREIGN PATENT DOCUMENTS

JP                03272207 A  * 12/1991 ............ H03B/5/32

* cited by examiner

*Primary Examiner*—Robert Pascal
*Assistant Examiner*—Joseph Chang
(74) *Attorney, Agent, or Firm*—Katten Muchin Zavis Rosenman

(57) ABSTRACT

A surface mounting quartz crystal oscillator has an IC chip containing an oscillator circuit, and a quartz crystal unit which are sealed in a container body by a metal cover, wherein stray capacitances C1, C2 are equivalently in parallel with oscillation capacitors Ca, Cb connected to one and the other ends of the crystal unit, respectively. A gap between the IC chip and a crystal blank of the crystal unit, and a gap between the crystal blank and metal cover are set in accordance with a changing amount of the oscillation frequency due to a change in the stray capacitances C1, C2 in a direction in which a change in equivalent series capacitance is reduced, as viewed from the crystal unit, while maintaining a spacing between the IC chip and metal cover.

7 Claims, 4 Drawing Sheets

SURFACE MOUNTING CRYSTAL OSCILLATOR

BACKGROUND OF THE INVENTION

1. Field of the Invention

The present invention relates to a quartz crystal oscillator of a surface-mount type, and more particularly, to a quartz crystal oscillator which prevents fluctuations in frequency when an impact is applied thereto.

2. Description of the Related Art

A surface mounting crystal oscillator is used mainly as a frequency reference source particularly for a variety of portable electronic devices such as portable telephones because of its compact size and light weight. In recent years, an increasingly strict tolerance is imposed for a frequency deviation of an oscillation frequency in a surface mounting crystal oscillator. For example, a crystal oscillator for a portable telephone is required to limit a frequency variation ratio with respect to a reference frequency (nominal frequency), for example, within ±1 ppm.

FIG. 1 is a cross-sectional view illustrating an exemplary configuration of a conventional surface mounting crystal oscillator. As disclosed, for example, in Japanese Patent No. 2969526 (JP, 2969526, B), the illustrated crystal oscillator comprises IC (integrated circuit) chip 2 and quartz crystal blank 3 contained in container body 1, and metal cover 4 overlaid to hermetically encapsulate these components. Container body 1, which is made of laminated ceramics, is formed with a recess on its top surface, and the recess has steps on its inner wall. On the bottom and side surfaces of container body 1, which define outer surfaces thereof, mounting electrodes 5 are formed each for surface mounting. Mounting electrodes 5 are used to connect the crystal oscillator to an external circuit which is provided on a printed wiring board when the crystal oscillator is mounted on the printed wiring board.

IC chip 2 has an oscillator circuit integrated therein, which utilizes a quartz crystal unit comprised of crystal blank 3. FIG. 2 illustrates the circuit arrangement of the crystal oscillator. Oscillation capacitors Ca, Cb are connected respectively to one and the other ends of crystal unit 3A comprised of crystal blank 3 for making up a resonance circuit. These capacitors Ca, Cb have their other ends connected to a ground potential. An input and an output terminal of oscillation amplifier 6 are connected respectively to one and the other ends of crystal unit 3A for amplifying and feeding back an oscillation frequency which depends on the resonance circuit. Feedback resistor 7 is also connected between the input and output terminals of oscillation amplifier 6. Within the circuit indicated by solid lines in FIG. 2, portions except for crystal unit 3A are formed in IC chip 2.

Although not shown in FIG. 2, a pair of connection terminals for use in connection with crystal unit 3A, a power supply terminal, an output terminal, and a ground terminal are provided on one major surface of IC chip 2. Corresponding to these terminals, a circuit pattern is formed on the bottom of the recess in container body 1. Then, the one major surface of IC chip 2, on which the respective terminals are exposed, is secured on the bottom of the recess in container body 1 by facedown bonding. The facedown bonding involves, for example, providing a gold (Au) bump on each of the terminals exposed on the one major surface of IC chip 2, and bonding the gold bumps with the circuit pattern on container body 1 by ultrasonic thermocompression bonding. Container body 1 is provided with via-holes and the like for electrically connecting the circuit pattern on the bottom of the recess with mounting electrodes 5, such that the power supply terminal, output terminal, and ground terminal of IC chip 2 are electrically connected to mounting electrodes 5 by the facedown bonding.

Crystal blank 3 is, for example, an AT-cut quartz crystal blank, and is provided with a pair of excitation electrodes (not shown) on both major surfaces, and extending electrodes are extended from these excitation electrodes toward both ends of one side of crystal blank 3. Then, crystal blank 3 is held within the recess by securing leading ends of both extending electrodes to the steps formed on the inner wall of container body 1 with conductive adhesive 8. In this event, the other end of crystal blank 3 is carried on the step in contact with or in close proximity to the same. A pair of extending electrodes of crystal blank 3 are connected to the pair of connection terminals of IC chip 2 through the circuit pattern formed within the recess of container body 1. Metal cover 4 is bonded to metal ring 9 disposed on the top surface of a side wall of container body 1 by seam welding to seal the opening face of the recess.

In the crystal oscillator configured as described above, IC chip 2 and crystal blank 3 are accommodated in a single recess of container body 1, so that the crystal oscillator can be reduced particularly in height, as compared with a crystal oscillator which has recesses in both major surfaces of a container such that a crystal blank is hermetically accommodated in the recess in one major surface while an IC chip is accommodated in the recess in the other major surface. When the container body is formed with recesses on both major surfaces, the resulting container body has an H-shaped cross-section. Since the container body is required to withstand a force applied thereto when the IC chip is secured by compression bonding, the strength of the container body must be enhanced by increasing the thickness of a horizontal part in the H-shaped cross-section, resulting in a correspondingly increased height of the container body.

However, the conventional surface mounting crystal oscillator as illustrated in FIG. 1 has a problem that the frequency fluctuates when a drop impact is applied to the crystal oscillator. Specifically, when a finished crystal oscillator is applied with an impact in a drop impact test by dropping the same to a concrete floor from 1.5 meters above, the oscillation frequency fluctuates in the positive direction, resulting in a failure in satisfying a regulation against the oscillation frequency which stipulates, for example, that a deviation $\Delta f/f$ shall be within 1 ppm, where f is a nominal oscillation frequency, and $\Delta f$ is a frequency changing amount from the nominal oscillation frequency.

The drop impact test herein referred to involves dropping a surface mounting crystal oscillator twice in positive and negative directions, respectively, with respect to three-dimensional coordinate axis directions (X-, Y-, Z-directions) in one cycle as defined herein, and recording a frequency change ($\Delta f/f$) in each cycle. Here, the test is conducted in ten cycles. FIG. 3 shows the result of the drop impact test conducted for a conventional surface mounting crystal oscillator, the oscillation frequency (nominal frequency) f of which is 14.4 MHz. Ten crystal oscillators were tested, and FIG. 3 shows frequency changes in each cycle for the one which presented the largest frequency change and the one which presented the smallest frequency change, respectively.

SUMMARY OF THE INVENTION

It is therefore an object of the present invention to provide a surface mounting quartz crystal oscillator which maintains a small height, reduces a frequency change caused by an impact, and has a small frequency deviation and a small frequency changing amount.

The present inventors diligently made investigations on fluctuations in frequency caused by a drop impact as described below to complete the present invention. Specifically, the object of the present invention is achieved by a surface mounting crystal oscillator which includes a container body having a recess, a crystal blank having one end held on a step formed on an inner wall of the recess and functioning as a crystal unit vibrator, an IC chip secured on the bottom of the recess, and a metal cover for sealing an opening face of the recess. The IC chip has integrated therein a first and a second capacitor connected to one and the other ends of the crystal unit, respectively, to form a resonance circuit, and an oscillation amplifying element for amplifying an oscillation frequency depending on the resonance circuit and feeding back the amplified oscillation frequency. A first stray capacitance produced between the crystal blank and IC chip is connected in parallel with the first capacitor, while a second stray capacitance produced between the crystal blank and metal cover is connected in parallel with the second capacitor. A first gap defined between the crystal blank and IC chip, and a second gap defined between the crystal blank and metal cover are set in accordance with a changing amount of the oscillation frequency due to a change in the first stray capacitance and the second stray capacitance in a direction in which a change in an equivalent series capacitance is reduced as viewed from the crystal unit, while maintaining a gap between the IC chip and metal cover constant.

Next, description will be made on the result of the investigations made by the present inventors for achieving the object of the present invention.

In the surface mounting crystal oscillator in the configuration illustrated in FIG. 1, IC chip 2 and metal cover 4 are positioned on the upper and lower sides of crystal blank 3, respectively. Then, a metal conductor, i.e., a chip conductor is formed on a second major surface of IC chip 2, i.e., the surface opposing crystal blank 3. This chip conductor is grounded to a ground potential together with metal cover 4. Therefore, as indicated by broken lines in the equivalent circuit of FIG. 2, stray capacitances C1, C2 are produced between the excitation electrodes on both major surfaces of crystal blank 3, i.e., both terminals of crystal unit 3A in the circuit diagram, and the chip conductor and metal cover 4, respectively. These stray capacitances C1, C2 are connected in parallel with the aforementioned oscillation capacitors Ca, Cb, respectively. In FIG. 1, stray capacitance C1 is connected to capacitor Ca and stray capacitance C2 to capacitor Cb. However, if crystal blank 3 is secured to container body 1 upside down, stray capacitance C2 is connected to capacitor Ca and stray capacitance C1 to capacitor Cb.

In the configuration illustrated in FIG. 1, the other end of crystal blank 3 is not secured and therefore functions as a free end with respect to the fixed one end, i.e., the end which is secured to the step formed on the recess. If the surface mounting crystal oscillator is dropped and receives an impact under this situation, the other end of crystal blank 3 swings up and down about the fixed one end. However, since the other end of crystal blank 3 is in contact with or in close proximity to the step formed on the recess of container body 1, its downward swinging motions or movements are limited by the step. This also causes a stress in conductive adhesive 8 which fixes the one end of crystal blank 3. Then, conductive adhesive 8 is changed in state into deformation, with the result that crystal blank 3 is inclined, for example, diagonally upward toward the other end and held in this inclined state. In other words, the other end of crystal blank 3 is lifted up.

As the other end of crystal blank 3 is lifted up, substantial gaps d1, d2 change between crystal blank 3 and IC chip 2 and between crystal blank 3 and metal cover 4, respectively, causing an associated change in stray capacitances C1, C2. In this event, stray capacitance C1 changes in a decreasing direction since gap d1 is increased, while stray capacitance C2 changes in an increasing direction since gap d2 is reduced. As is well known, stray capacitances C1, C2 are determined by:

$$C1 = \in S1/d1;$$

and $$C2 = \in S2/d2,$$

where $\in$ is a dielectric constant of the gaps; S1 is the area of the excitation electrode of crystal blank 3 opposing IC chip 2; and S2 is the area of the excitation electrode of crystal blank 3 opposing metal cover 4.

Since stray capacitances C1, C2 are connected in parallel with the aforementioned oscillation capacitors Ca, Cb, respectively, a change in stray capacitances C1, C2 results in associated fluctuations in the oscillation frequency. The oscillation frequency of a quartz crystal oscillator depends on an equivalent series capacitance, when the circuit is viewed from crystal unit 3A, and becomes higher as the equivalent series capacitance is smaller. Equivalent series capacitance CQ in this event is expressed by equation (1):

$$CQ = (Ca + C1)(Cb + C2)/\{(Ca + C1) + (Cb + C2)\} \quad (1)$$
$$= CxCy/(Cx + Cy)$$

where Cx is a combined capacitance of Ca and C1, and Cy is a combined capacitance of Cb and C2. Strictly, input and output capacitances of oscillation amplifier 6 should be taken into account, but they are omitted for convenience because the description will not be affected by them.

The following description will be made on investigations on individual cases based on the quantitative relationships between oscillation capacitances Ca, Cb and between stray capacitances C1, C2, and the like.

Case 1

First, assuming that oscillation capacitances Ca, Cb have the same value (Ca=Cb), and gaps d1, d2 are equal (d1=d2) to each other, i.e., initial stray capacitances C1, C2 are equal (C1=C2) before a drop impact. Therefore, combined capacitances Cx, Cy are also equal. As described above, the other end of crystal blank 3 is lifted up after the drop impact to increase substantial gap d1, so that stray capacitance C1 is reduced after the drop impact. This changing amount of stray capacitance C1 is represented by ΔC1. On the contrary, stray capacitance C2 is increased because gap d2 is narrowed down. This changing amount of stray capacitance C2 is represented by ΔC2.

In this event, since capacitances of oscillation capacitors Ca, Cb are equal, and initial stray capacitances C1, C2 are also equal, changing amounts ΔC1, ΔC2 of stray capacitances C1, C2 in decreasing and increasing directions are substantially equal, while changing amounts ΔCx, ΔCy of combined capacitances Cx, Cy are also substantially equal. As appreciated, a reduction in stray capacitance C1 due to a drop impact results in a like reduction in combined capacitance Cx, while an increased in stray capacitance C2 results in a like increase in combined capacitance Cy.

Basically, an increase in stray capacitances C1, C2 and combined capacitances Cx, Cy associated therewith results in an increase in equivalent series capacitance CQ and an eventual decrease in the oscillation frequency. Conversely, a reduction in stray capacitances C1, C2 and combined capacitances Cx, Cy associated therewith results in a reduction in equivalent series capacitance CQ and an eventual increase in the oscillation frequency. In this event, since changing amounts $\Delta C1$, $\Delta C2$ in the increasing and decreasing directions are substantially equal while associated $\Delta Cx$, $\Delta Cy$ are also substantially equal, there is few change in the oscillation frequency before and after the impact because the changing amount of the increasing oscillation frequency is canceled out by the changing amount of the decreasing oscillation frequency.

Case 2

Assuming that oscillation capacitors Ca, Cb have the same value (Ca=Cb), and gap d1 is larger than gap d2 (d1>d2), i.e., stray capacitance C1 is smaller than C2 (C1<C2), combined capacitance Cx is smaller than Cy (Cx<Cy). In this event, for stray capacitance C1 after a drop impact, larger gap d1 causes reduced changing amount $\Delta C1$ in the decreasing direction and reduced changing amount $\Delta Cx$ of combined capacitance Cx. Conversely, for stray capacitance C2, smaller gap d2 causes increased changing amount $\Delta C2$ in the increasing direction, and increased changing amount $\Delta Cy$ of combined capacitance Cy. Thus, the oscillation frequency is reduced after the impact is applied because changing amounts $\Delta C2$ and $\Delta Cy$ in the increasing direction are larger than changing amounts $\Delta C1$ and $\Delta Cx$ in the decreasing direction, respectively.

Case 3

Assuming that oscillation capacitors Ca, Cb have the same value (Ca=Cb), and gap d1 is smaller than gap d2 (d1<d2), i.e., stray capacitance C1 is larger than C2 (C1>C2), combined capacitance Cx is larger than Cy (Cx>Cy). In this event, for stray capacitance C1 after a drop impact, smaller gap d1 causes increased changing amount $\Delta C1$ in the decreasing direction and increased changing amount $\Delta Cx$ of combined capacitance Cx. Conversely, for stray capacitance C2, larger gap d2 causes reduced changing amount $\Delta C2$ in the increasing direction and reduced changing amount $\Delta Cy$ of combined capacitance Cy. Thus, the oscillation frequency is increased after the impact is applied because changing amount $\Delta C1$ and $\Delta Cx$ in the decreasing direction is larger than changing amount $\Delta C2$ and $\Delta Cx$ in the increasing direction, respectively.

When the conventional surface mounting crystal oscillator configured as illustrated in FIG. 1 was manufactured, distance d from the surface of the IC chip, i.e., the surface of the chip conductor, to metal cover 4 was approximately 0.5 mm in the thus manufactured prototype crystal oscillator. In addition, gap d1 between crystal blank 3 and IC chip 2 was significantly smaller than gap d2 between crystal blank 3 and metal cover 4 due to the structure of the surface mounting crystal oscillator. Therefore, the prototype crystal oscillator falls under the aforementioned Case 3, where there is a larger changing amount $\Delta C1$ of stray capacitance C1 which is a change in the decreasing direction due to gap d1 between crystal blank 3 and IC chip 2, so that it is demonstrated that the crystal oscillator presents a large change in frequency in the increasing direction after the drop impact.

A quartz crystal oscillator which does not contemplate its compact size is free from the problematic fluctuations in frequency resulting from an impact because this type of crystal oscillator has a large height and a large distance from a chip conductor to a metal cover. Specifically, the large distance between the chip conductor and metal cover results in small stray capacitances C1, C2 themselves, and a change in capacitance, if any, associated with a change in the distance caused by a drop impact would exert a negligible influence on the oscillation frequency, so that such a crystal oscillator is free from the problem as described above. Stated another way, the problem of fluctuations in frequency resulting from a drop impact is peculiar in surface mounting crystal oscillators which are intended for a reduction in size.

As described above, the present invention sets the gap between the IC chip and crystal blank, and the gap between the crystal blank and metal cover in accordance with a changing amount of the oscillation frequency due to a change in the first and second stray capacitances C1, C2 respectively connected in parallel with first capacitor Ca and second capacitor Cb in a direction in which a change in equivalent series capacitance is reduced, as viewed from the crystal unit, while maintaining a gap between the IC chip and metal cover, so that changing amount $\Delta f/f$ of the oscillation frequency is reduced even if stray capacitances C1, C2 change after a drop impact. In addition, the crystal oscillator can maintain a small height because the spacing between the IC chip and metal cover is maintained constant.

DETAILED DESCRIPTION OF THE INVENTION

Figure 1:
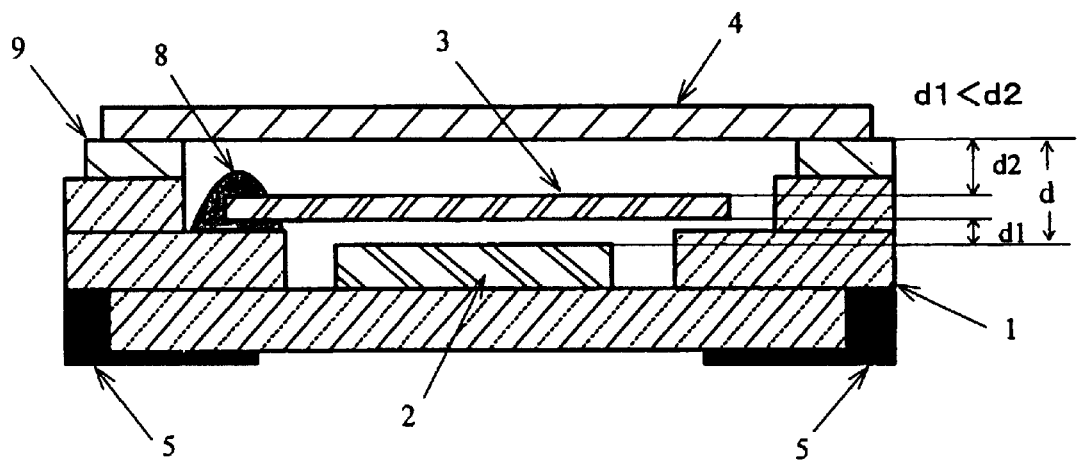
FIG. 1 is a cross-sectional view illustrating an exemplary arrangement of a conventional surface mounting crystal oscillator.
Figure 2:
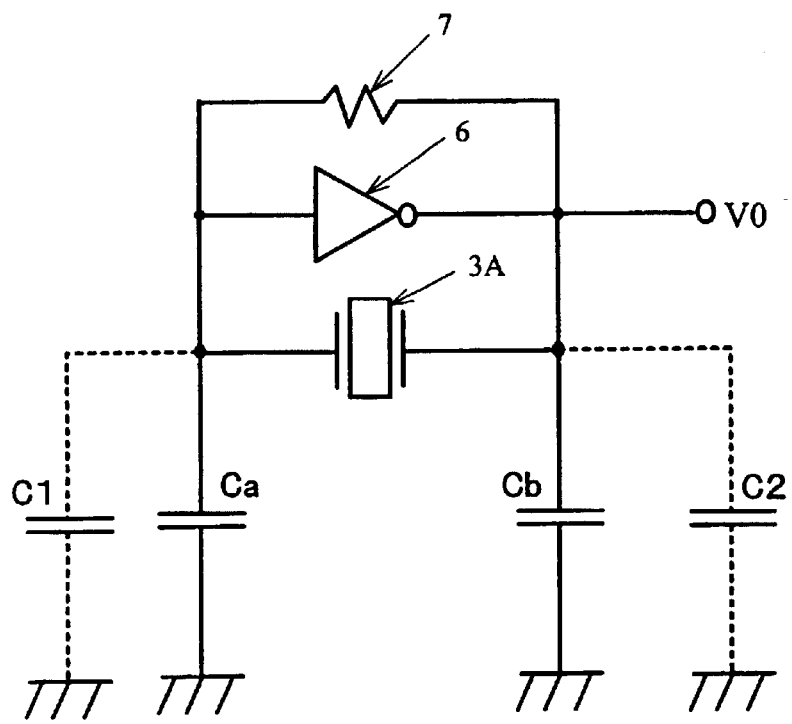
FIG. 2 is a circuit diagram illustrating an exemplary circuit configuration of the surface mounting crystal oscillator.
Figure 3:
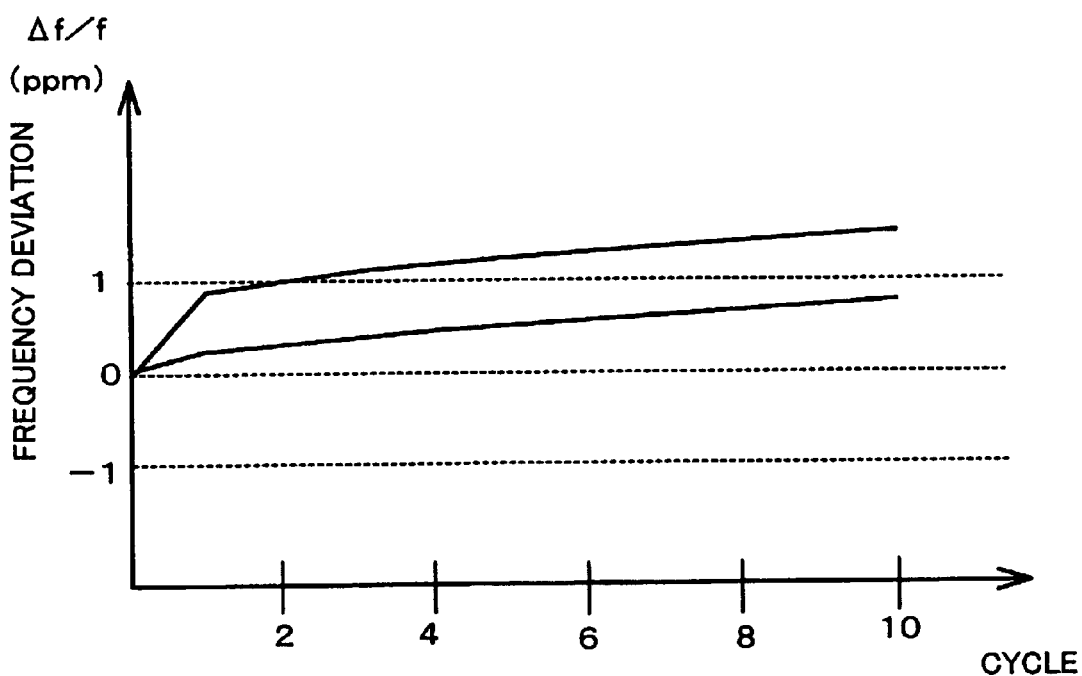
FIG. 3 is a graph showing a change in the oscillation frequency when a drop impact is applied to the conventional surface mounting crystal oscillator.
Figure 4:
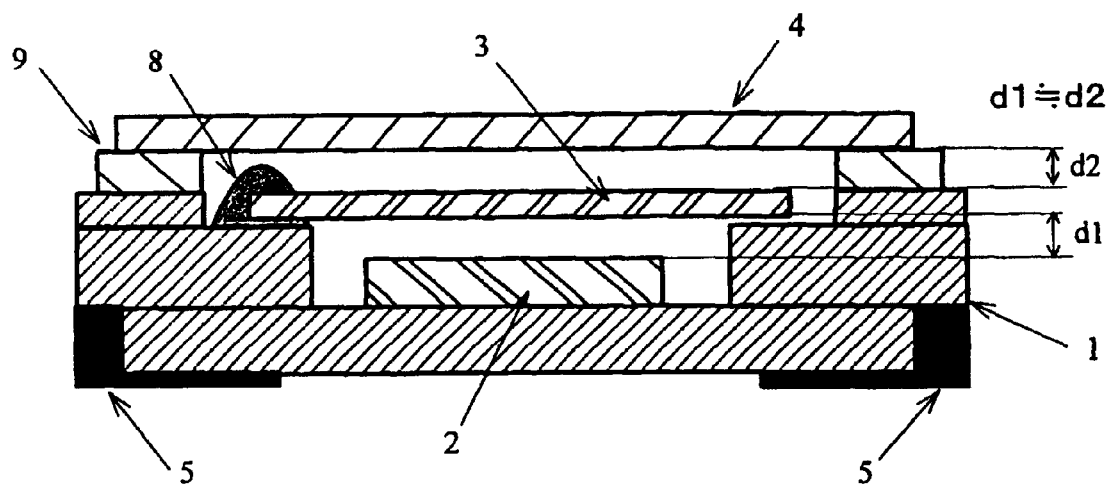
FIG. 4 is a cross-sectional view illustrating the configuration of a surface mounting crystal oscillator according to a first embodiment of the present invention.

Referring to FIG. 4 which illustrates a surface mounting crystal oscillator according to a first embodiment of the present invention, components designated the same reference numerals as those in FIG. 1 are identical to the counterparts in FIG. 1. Similar to the foregoing, the surface mounting crystal oscillator illustrated in FIG. 4 comprises IC chip 2 secured on the bottom of a recess in container body 1 and having oscillation capacitors and amplifier integrated therein; quartz crystal blank 3 (i.e., quartz crystal unit 3A) having one end held on a step on the inner wall of the recess, and excitation electrodes on both main surfaces; and metal cover 4 for sealing an opening face of the recess.

Assume herein that a relationship represented by Ca≈Cb is established between the capacitances of oscillation capacitors Ca, Cb. In this event, gap d between IC chip 2 and metal cover 4 is maintained, for example, at 5 mm which is the same as before, while gap d1 between crystal blank 3 and IC chip 2 is substantially equal to gap d2 between crystal blank 3 and metal cover 4 (d1≈d2).

With the foregoing configuration, stray capacitances C1, C2 connected in parallel with oscillation capacitances Ca, Cb are equal before a drop impact. When the crystal oscillator is applied with a drop impact, upward inclination of the other end of crystal blank 3 after the drop impact causes a change in stray capacitances C1, C2 in decreasing and increasing directions, depending on a change in gaps d1, d2, by changing amounts ΔC1, ΔC2, respectively. Changing amounts ΔC1, ΔC2 are substantially equal except that their changing directions are opposite to each other. In other words, since gaps d1, d2 are increased and decreased by an equal amount in directions opposite to each other, resultant changing amounts ΔC1, ΔC2 are also equal and in opposite direction.

With the change in the stray capacitances, combined capacitances Cx, Cy are also decreased and increased by equal changing amounts ΔCx, ΔCy, so that a small change is found in equivalent series capacitance CQ, when viewed from crystal unit 3A, resulting in a reduced change in the oscillation frequency before and after the drop impact.

Figure 5:
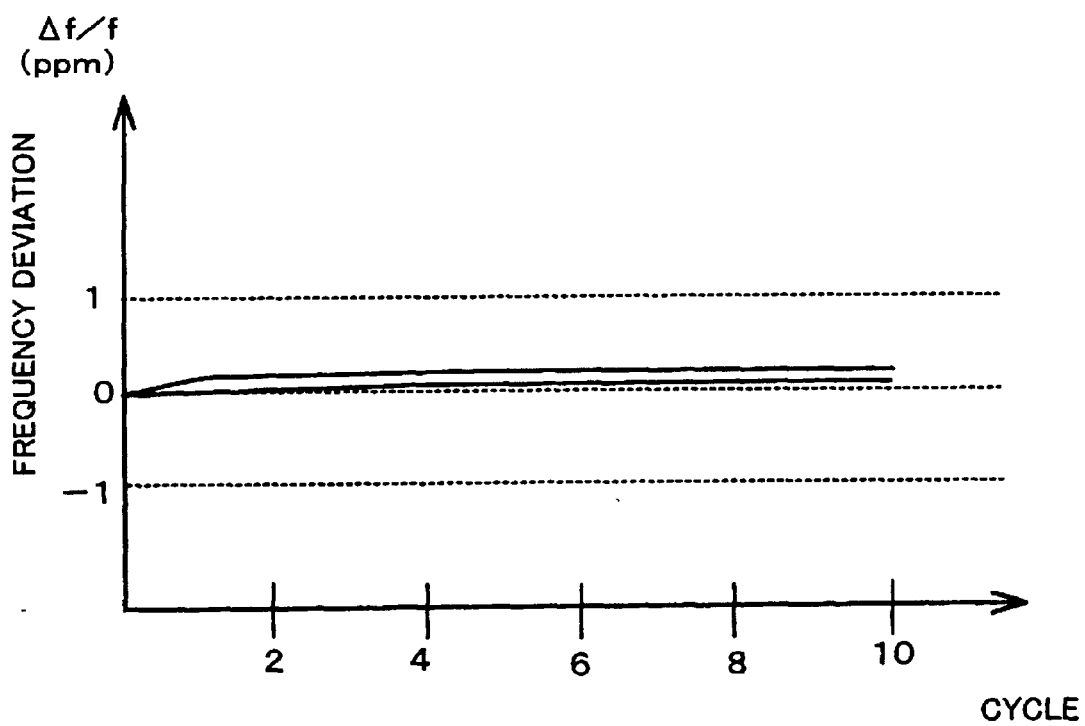
FIG. 5 is a graph showing a change in the oscillation frequency when a drop impact is applied to the surface mounting crystal oscillator according to the first embodiment.

The result of a drop impact test similar to the foregoing (ten cycles, ten units) conducted to the crystal oscillators of the first embodiment reveals that all crystal oscillators presented Δf/f within 0.3 ppm with extremely small variations, as shown in FIG. 5. Thus, the crystal oscillator sufficiently satisfies the strict regulation against the frequency deviation which stipulates, for example, that the frequency deviation shall be within ±1 ppm. In addition, since gap d between IC chip 2 and metal cover 4 is maintained constant, a small height can be still ensured.

Figure 6:
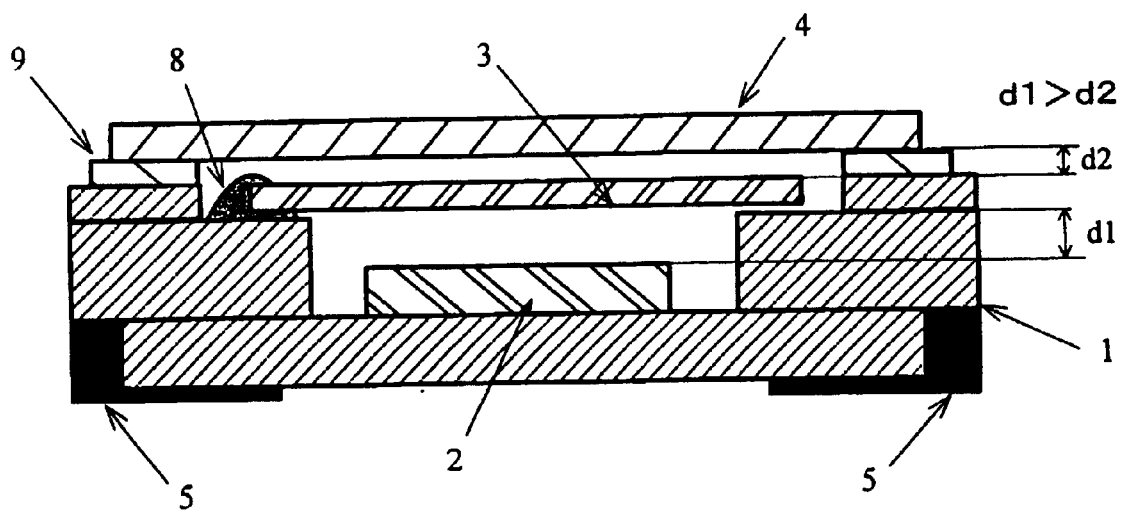
FIG. 6 is a cross-sectional view illustrating the configuration of a surface mounting crystal oscillator according to a second embodiment of the present invention.

Next, description will be made on a surface mounting crystal oscillator according to a second embodiment of the present invention with reference to FIG. 6. The illustrated surface mounting crystal oscillator is substantially similar to that of the first embodiment except that the capacitance of oscillation capacitor Ca is larger than the other oscillation capacitance of Cb (Ca>Cb). In this event, gap d1 between crystal blank 3 and IC chip 2 is made smaller than gap d2 between crystal blank 3 and metal cover 4 (d1<d2). Gap d between IC chip 2 and metal cover 4 is maintained the same as before.

With the foregoing configuration, stray capacitance C1 is larger than C2 (C1>C2) before a drop impact because gap d1 is relatively smaller than gap d2. Then, after the drop impact, since gap d1 between crystal blank 3 and IC chip 2 is likewise smaller than d2, changing amount ΔC1 of stray capacitance C1 is relatively increased in the decreasing direction. Conversely, since gap d2 between crystal blank 3 and metal cover 4 is relatively larger than d1, changing amount ΔC2 of stray capacitance C2 is relatively reduced in the increasing direction. Stray capacitance C1 changed by large changing amount ΔC1 in the decreasing direction is connected in parallel with oscillation capacitor Ca, the capacitance of which is larger than that of Cb, so that changing amount ΔCx of combined capacitance Cx is smaller as compared with that found when stray capacitance C1 is connected to oscillation capacitor Cb. This results in a small change in equivalent series capacitance CQ. Thus, as is the case with the first embodiment, the crystal oscillator of the second embodiment reduces a change in frequency before and after the drop impact and therefore satisfies the strict regulation related to the frequency deviation, as well as maintains a compact size.

In the foregoing description, the relationship represented by Ca>Cb is established between oscillation capacitors Ca, Cb. Conversely, when Ca<Cb, gap d1 between crystal blank 3 and IC chip 2 is made larger than gap d2 between crystal blank 3 and metal cover 4 (d1>d2). Gap d between IC chip 2 and metal cover 4 is maintained the same as before.

With the foregoing configuration, stray capacitance C2 is larger than C1 (C2>C1) before a drop impact because gap d2 is relatively smaller than gap d1, and stray capacitance C2 is changed by the drop impact in the increasing direction by larger changing amount ΔC2. Conversely, since gap d2 between crystal blank 3 and metal cover 4 is relatively smaller than d1, changing amount ΔC1 of stray capacitance C1 is decreased in the decreasing direction. Stray capacitance C2 changed by large changing amount ΔC2 in the increasing direction is connected in parallel with oscillation capacitor Cb, the capacitance of which is larger than that of Ca, so that changing amount ΔCy of combined capacitance Cy is smaller as compared with that found when stray capacitance C2 is connected to oscillation capacitor Ca. This results in a small change in equivalent series capacitance CQ. Thus, as is the case with the foregoing, the crystal oscillator reduces a change in frequency before and after the drop impact and therefore satisfies the strict regulation related to the frequency deviation, as well as maintains a compact size.

Figure 7:
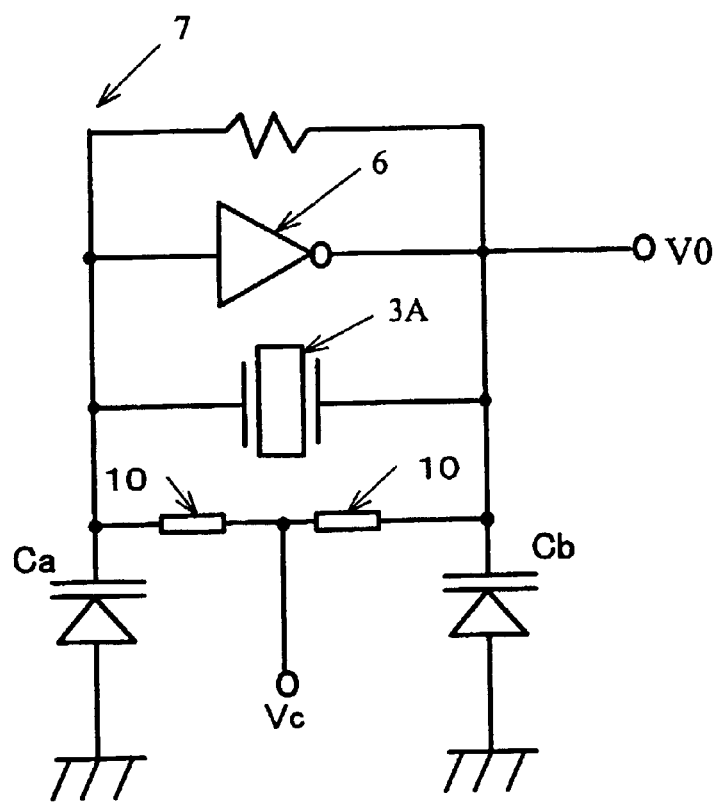
FIG. 7 is cross-sectional view illustrating the configuration of a surface mounting crystal oscillator according to another embodiment of the present invention.

While the respective embodiments described above use fixed oscillation capacitors Ca, Cb, at least one of these capacitors may be replaced with a voltage variable capacitance element which is applied with control voltage Vc through high frequency blocking resistor 10 to vary the oscillation frequency, as illustrated in FIG. 7. In this manner, a so-called voltage controlled crystal oscillator can be implemented. The present invention can be applied as well to the voltage controlled crystal oscillator. In this case, control voltage Vc may be used as a temperature compensating voltage for compensating the surface mounting crystal oscillator for the frequency-to-temperature characteristic to provide a temperature compensated crystal oscillator. It should be noted that gaps d1, d2 are set based on reference capacitances for providing the nominal oscillation frequency.

When a reduction in gap d2 between crystal blank 3 and metal cover 4 could cause conductive adhesive 8 to come into contact with metal ring 9 or metal cover 4, conductive adhesive 8 may be applied only on the lower surface of crystal blank 3 shown in the drawings. If a holding strength is damaged by the application of conductive adhesive 8 only on the lower surface, an insulating adhesive may be applied from the top surface of crystal blank 3. Such approaches can be optionally applied as appropriate.

Also, while metal ring 9 is disposed on the top surface of container body 1 to bond metal cover 8 by seam welding, metal ring 9 may be replaced with a metal film formed through metallization. Alternatively, beam welding or the like may be used instead of seam welding.

What is claimed is:
1. A surface mounting crystal oscillator comprising:
   a container body having a recess;
   a crystal blank having one end held on a step formed on an inner wall of said recess and functioning as a crystal unit;
   an IC chip secured on a bottom of said recess, said IC chip having integrated therein a first and a second capacitor connected to one and the other ends of said crystal unit, respectively, to form a resonance circuit, and an oscillation amplifying element for amplifying an oscillation frequency depending on said resonance circuit and feeding back the amplified oscillation frequency; and a metal cover for sealing an opening face of said recess, wherein a first stray capacitance produced between said crystal blank and said IC chip is connected in parallel with said first capacitor, and a second stray capacitance produced between said crystal blank and said metal cover is connected in parallel with said second capacitor, and a first gap defined between said crystal blank and said IC chip, and a second gap defined between said crystal blank and said metal cover are set in accordance with a changing amount of the oscillation frequency due to a change in said first stray capacitance and said second stray capacitance in a direction in which a change in an equivalent series capacitance is reduced as viewed from said crystal unit, while maintaining a spacing between said IC chip and said metal cover constant.

2. The crystal oscillator according to claim 1, wherein said first capacitor has a capacitance substantially equal to a capacitance of said second capacitor, and said first gap is substantially equal to said second gap.

3. The crystal oscillator according to claim 1, wherein said first capacitor has a capacitance larger than a capacitance of said second capacitor, and said second gap is larger than said first gap.

4. The crystal oscillator according to claim 1, wherein said second capacitor has a capacitance larger than a capacitance of said first capacitor, and said first gap is larger than said second gap.

5. The crystal oscillator according to claim 1, wherein spacing between said IC chip and said metal cover is equal to or less than 0.5 mm.

6. The crystal oscillator according to claim 1, wherein at least one of said first and second capacitors is a voltage variable capacitance element.

7. The crystal oscillator according to claim 1, wherein said oscillation frequency changes by an amount within ±1 ppm.

* * * * *